United States Patent
Hertkorn et al.

(10) Patent No.: US 9,680,048 B2
(45) Date of Patent: Jun. 13, 2017

(54) METHOD FOR PRODUCING A RADIATION-EMITTING SEMICONDUCTOR COMPONENT

(71) Applicant: OSRAM Opto Semiconductors GmbH, Regensburg (DE)

(72) Inventors: Joachim Hertkorn, Alteglofsheim (DE); Lorenzo Zini, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/378,643

(22) PCT Filed: Jan. 10, 2013

(86) PCT No.: PCT/EP2013/050414
§ 371 (c)(1),
(2) Date: Aug. 13, 2014

(87) PCT Pub. No.: WO2013/120638
PCT Pub. Date: Aug. 22, 2013

(65) Prior Publication Data
US 2015/0031150 A1    Jan. 29, 2015

(30) Foreign Application Priority Data

Feb. 15, 2012 (DE) .................. 10 2012 101 211

(51) Int. Cl.
*H01L 33/00* (2010.01)
*H01L 33/22* (2010.01)

(52) U.S. Cl.
CPC .......... *H01L 33/005* (2013.01); *H01L 33/007* (2013.01); *H01L 33/22* (2013.01); *H01L 33/0079* (2013.01); *H01L 2924/0002* (2013.01)

(58) Field of Classification Search
CPC .......... H01L 21/0254; H01L 21/02458; H01L 21/0262; H01L 21/02639; H01L 21/02647;
(Continued)

(56) References Cited

U.S. PATENT DOCUMENTS

| 7,759,689 B2 * | 7/2010 | Bour .............................. 257/96 |
| 2004/0232428 A1 * | 11/2004 | Senda .................. H01L 33/007 257/79 |

(Continued)

FOREIGN PATENT DOCUMENTS

| DE | 102006017573 A1 | 10/2007 |
| DE | 102008022503 A1 | 11/2008 |

(Continued)

OTHER PUBLICATIONS

Hiramatsu et al., "Fabrication and characterization of low defect density GaN using facet-controlled epitaxial lateral overgrowth (FACELO)", Journal of Crystal Growth, vol. 221, Dec. 2000, pp. 316-326.

(Continued)

*Primary Examiner* — Tony Tran
(74) *Attorney, Agent, or Firm* — McDermott Will & Emery LLP (57) ABSTRACT

A method for producing a radiation-emitting semiconductor component is provided, comprising the following steps: —providing a growth substrate (1), —depositing a nucleation layer (2) on the growth substrate (1), —applying a structured dielectric layer (3) to the nucleation layer (2), —applying an epitaxial layer (4) by means of a FACELO process to the structured dielectric layer (3), —epitaxial growth of an epitaxial layer sequence (5) on the epitaxial (Continued)

layer (4), wherein the epitaxial layer sequence (5) comprises an active zone (6) that is suitable for producing electromagnetic radiation.

22 Claims, 7 Drawing Sheets

(58) Field of Classification Search
CPC ............ H01L 2924/00; H01L 29/2003; H01L 2924/0002; H01L 29/66462
See application file for complete search history.

(56) References Cited

U.S. PATENT DOCUMENTS

| | | | |
|---|---|---|---|
| 2006/0099781 A1* | 5/2006 | Beaumont | C30B 25/02 438/509 |
| 2008/0258133 A1 | 10/2008 | Seong | |
| 2010/0102307 A1* | 4/2010 | Chua et al. | 257/43 |
| 2010/0314633 A1 | 12/2010 | Donofrio et al. | |
| 2011/0266569 A1* | 11/2011 | Basin et al. | 257/98 |

FOREIGN PATENT DOCUMENTS

| | | | |
|---|---|---|---|
| DE | 102009020819 | A1 | 4/2010 |
| DE | 102010046792 | A1 | 3/2012 |
| DE | 102011012608 | * | 8/2012 |
| DE | 102011012608 | A1 | 8/2012 |
| DE | 102011114671 | A1 | 4/2013 |

OTHER PUBLICATIONS

Nakamura et al., "InGaN/GaN/AlGaN-Based Laser Diodes with Modulation-Doped Strained-Layer Superlattices", Japanese Journal of Applied Physics, vol. 36, Pt. 2, No. 12A, Dec. 1, 1997, pp. L 1568-L 1571.

Wunderer et al., "Fabrication of 3D InGaN/GaN structures providing semipolar GaN planes for efficient green light emission", Physica Status Solidi, vol. 6, No. S2, Jun. 2009, pp. S490-S493.

Wunderer et al., Semipolar GaInN/GaN light-emitting diodes grown on honeycomb patterned substrates, Physica Status Solidi, vol. 7, No. 7-8, Jul. 2010, pp. 2140-2143.

* cited by examiner

METHOD FOR PRODUCING A RADIATION-EMITTING SEMICONDUCTOR COMPONENT

A method for producing a radiation-emitting semiconductor component is specified.

A method for producing a radiation-emitting semiconductor component is described in the document DE 10 2011 012 608, for example. In this method, a structured dielectric layer is used as a hard mask for producing radiation coupling-out structures.

It is an object of the present invention to specify an improved method for producing radiation coupling-out structures in which, in particular, the accuracy in the positioning of the radiation coupling-out structures is improved. Furthermore, the intention is to achieve a reduction of defects during the epitaxial growth of the semiconductor layer sequence comprising the active, radiation-generating zone.

This object is achieved by means of a method comprising the steps of patent claim 1. Advantageous developments and embodiments of the method are specified in the dependent claims.

The method comprises in particular the following steps:
providing a growth substrate,
depositing a nucleation layer on the growth substrate,
applying a structured dielectric layer to the nucleation layer,
applying an epitaxial layer on the structured dielectric layer by means of a FACELO method,
epitaxially growing an epitaxial semiconductor layer sequence onto the epitaxial layer, wherein the epitaxial semiconductor layer sequence comprises an active zone that generates electromagnetic radiation, in particular visible light, during operation.

A FACELO method (Facet Assisted Epitaxial Lateral Overgrowth) generally involves providing a semiconductor surface with a structured mask layer. In this case, the mask layer is configured in such a way that a semiconductor material subsequently deposited epitaxially on the semiconductor surface grows only poorly on the mask layer. In this case, a suitable material for the mask layer is for example an oxide, such as silicon oxide, or a nitride, such as silicon nitride or tungsten nitride. In particular, a combination of silicon oxide and silicon nitride is also conceivable as material for the mask layer. In the FACELO method, the semiconductor surface provided with the structured mask layer is generally introduced into a reactor and a semiconductor material is deposited epitaxially. During the epitaxial deposition of the semiconductor material, growth firstly begins at the locations of the semiconductor surface which are free of the mask layer. In this case, semiconductor material is firstly initially preferably deposited in triangular structures on the exposed locations of the semiconductor surface. In the further course of the epitaxial deposition, the semiconductor material is then predominantly grown laterally over the mask layer. In general, the epitaxial deposition is continued until the epitaxially deposited layer has attained a certain thickness, measured from the mask layer.

In the present case, the structured dielectric layer is preferably used as a mask layer in the FACELO method.

In particular, an epitaxial layer having comparatively few defects is produced by means of a FACELO method. Preferably, the defect density of the epitaxial layer produced by means of the FACELO method is not greater than $10^8$.

Particularly preferably, the defect density of the epitaxial layer produced by means of the FACELO method is between $5*10^6$ and $5*10^7$ inclusive.

Particularly preferably, the epitaxial growth, in particular the FACELO method, is carried out by means of MOVPE (metal organic vapor phase epitaxy).

In the present case, use is made of the concept of employing the structured dielectric layer as a mask layer during a FACELO method in order to obtain a defect-reduced epitaxially grown layer. The surface of this epitaxial defect-reduced layer is then used as a growth surface for the epitaxial semiconductor layer sequence with the active radiation-generating zone. On account of the low defect density of the epitaxial layer, it is advantageously possible for the semiconductor layer sequence deposited on this layer, and in particular the active zone, to have a low defect density.

The active zone preferably comprises a pn junction, a double heterostructure, a single quantum well or, particularly preferably, a multi quantum well structure (MQW) for generating radiation. In this case, the designation quantum well structure does not include any indication about the dimensionality of the quantization. It therefore encompasses, inter alia, quantum wells, quantum wires and quantum dots and any combination of these structures.

Furthermore, relatively complex structures can be implemented in the active zone in this way, which leads to an increased efficiency of the semiconductor component. The relatively complex structures can be for example AlInGaN superlattices or InGaN prestresses.

Particularly if a growth substrate which comprises sapphire or is formed from sapphire is used, the wafer comprising the growth substrate, the dielectric layer and the epitaxial layer sequence generally advantageously has a comparatively low flexure. A particularly accurate structuring of subsequent layers, for example of the dielectric layer, can be achieved in this way.

The nucleation layer is preferably based on nitride compound semiconductor materials. Nitride compound semiconductor materials are compound semiconductor materials which contain nitrogen, such as materials from the system $In_xAl_yGa_{1-x-y}N$ where $0 \leq x \leq 1$, $0 \leq y \leq 1$ and $x+y \leq 1$. Particularly preferably, the nucleation layer is formed from a nitride compound semiconductor material.

The nucleation layer can be epitaxially deposited or sputtered, for example. A sputtered nucleation layer particularly preferably comprises aluminum nitride or is formed from aluminum nitride. Such a nucleation layer is described in the document DE 10 2011 114 671, for example, the disclosure content of which in this regard is incorporated by reference. An epitaxially deposited nucleation layer particularly preferably comprises gallium nitride or consists of gallium nitride.

Particularly preferably, the nucleation layer has a thickness of between 10 nm and 200 nm inclusive.

In a further embodiment, a further layer is deposited onto the nucleation layer, preferably by means of an epitaxy process. The further layer preferably has a thickness of between 50 nm and 3 µm inclusive. Preferably, the further layer comprises a nitride compound semiconductor material or is formed from a nitride compound semiconductor material. Particularly preferably, the further layer comprises gallium nitride or is formed from gallium nitride.

The epitaxial semiconductor layer sequence, and in particular the active zone, is also preferably based on a nitride compound semiconductor material.

The dielectric layer preferably comprises an oxidic or a nitridic material or is formed from an oxidic or a nitridic material. Particularly preferably, the dielectric layer comprises one of the following materials or is formed from one of the following materials: silicon oxide, silicon nitride, titanium nitride, tungsten nitride. In particular, the dielectric layer can also comprise a combination of the materials mentioned or consist of a combination of the materials mentioned.

The thickness of the dielectric layer is preferably between 50 nm and 400 nm inclusive.

In accordance with one embodiment, the dielectric layer is deposited over the whole area on the nucleation layer, for example by sputtering. Particularly preferably, in this embodiment, the nucleation layer is likewise sputtered since the deposition of the nucleation layer and the deposition of the dielectric layer can then be carried out without changing the deposition installation.

After the dielectric layer has been deposited over the whole area, it is structured, for example by means of photolithography. For this purpose, a photoresist layer is applied to the dielectric layer and structured by means of exposure. In a next step, the dielectric layer is partly removed, the photoresist layer serving as a mask. The dielectric layer can be removed by means of a dry etching process, for example. Alternatively, a wet-chemical etching process is also conceivable for structuring the dielectric layer.

Alternatively, it is also possible for the dielectric layer to be deposited in a structured fashion. In this case, a mask is used, for example, by means of which the material of the dielectric layer is deposited in a structured fashion.

Particularly preferably, the dielectric layer has a multiplicity of structure elements. The structure elements can be openings in the dielectric layer, for example, said openings preferably penetrating completely through the dielectric layer. Particularly preferably, the openings are arranged in a manner spaced apart from one another laterally.

Alternatively, the structure elements can also be islands. Particularly preferably, the islands are arranged in a manner spaced apart from one another. In other words, the islands are preferably embodied in a manner distinct from one another.

The structure units, that is to say the islands or the openings, for example, can be embodied for example in circular, hexagonal, rectangular or dodecagonal fashion.

The structure units preferably have a diameter that is not greater than 5 μm. This size is suitable in particular for the structured dielectric layer to serve as a mask layer in a FACELO method.

Furthermore, the structure units are preferably at a lateral distance from one another that is between 1 μm and 10 μm inclusive.

The structure units are particularly preferably arranged along an imaginary regular pattern. Preferably, said pattern is a two-dimensional hexagonal lattice.

In accordance with a further embodiment, a carrier is applied to the epitaxial semiconductor layer sequence and the growth substrate is preferably subsequently removed from the nucleation layer. The carrier preferably comprises one of the following materials or consists of one of the following materials: germanium, silicon, molybdenum, tungsten, nickel, copper.

The carrier is provided, in particular, for mechanically stabilizing the epitaxial semiconductor layer sequence.

The growth substrate can be sapphire or silicon carbide, for example. These materials are suitable in particular as growth substrate for nitride compound semiconductor materials.

The growth substrate can be removed from the nucleation layer by etching or grinding, for example. Particularly preferably, the growth substrate is removed from the nucleation layer by means of a laser lift-off method. A laser lift-off method is suitable, in particular, for removing from the epitaxial layer sequence a growth substrate which comprises sapphire or consists of sapphire.

Particularly preferably, after the removal of the growth substrate, the nucleation layer and, if appropriate, the further layer are also removed again, such that the dielectric structured layer is exposed. In this way, the structured dielectric layer can serve as a hard mask in a subsequent etching process.

The nucleation layer and, if appropriate, the further layer can be removed wet-chemically, for example, for instance with the aid of phosphoric acid. In this case, the phosphoric acid preferably has a temperature of approximately 80° C. Alternatively, the nucleation layer and, if appropriate, the further layer can also be removed wet-chemically using potassium hydroxide solution.

Particularly preferably, the growth substrate is removed by means of a laser lift-off method, wherein the nucleation layer comprises aluminum nitride or is formed from aluminum nitride. Such a nucleation layer is generally advantageously removed from the epitaxial semiconductor layer sequence simultaneously with the growth substrate during the laser lift-off method, such that an additional method step for removing the nucleation layer is obviated.

After the structured dielectric layer has been exposed, a further etching process is preferably carried out, during which the structured dielectric layer serves as a hard mask. During the etching process, regular three-dimensional structures are preferably produced in the surface of the epitaxial semiconductor layer sequence. The three-dimensional structures preferably serve as radiation coupling-out structures in the subsequent radiation-emitting semiconductor body. In this embodiment, the dielectric layer advantageously fulfils a double function. Firstly, the dielectric layer is used as a mask in the FACELO method in order to obtain a defect-reduced semiconductor layer sequence, and, secondly, the dielectric layer serves as a hard mask in order to produce three-dimensional radiation coupling-out structures.

Preferably the three-dimensional radiation coupling-out structures have the shape of a pyramid or of a truncated pyramid. Preferably, the radiation coupling-out structures have in each case six facets or in each case twelve facets. In this case, the term "facet" denotes that side face of the pyramid or of the truncated pyramid which connects the base face to the vertex.

Particularly preferably, at least the majority of the radiation coupling-out structures have the same height and the same base area within the scope of production and measurement tolerances. Particularly preferably, all of the radiation coupling-out structures have the same height and the same base area within the scope of production and measurement tolerances. In this case, a certain small proportion of the radiation coupling-out structures generally deviates slightly from this ideal stipulation in a manner governed by production.

Furthermore, adjacent radiation coupling-out structures particularly preferably are in each case at identical lateral distances.

The height, the lateral distance and the extent of the base face of the radiation coupling-out structures are for example in each case ≥200 nm. Preferably, the height, the lateral distance and the extent of the base face of the radiation coupling-out structures are in each case ≥600 nm. The extent of the base face of the radiation coupling-out structures is for example the diameter of the smallest circle which completely contains the base face. By way of example, if the radiation coupling-out structures are pyramidal or in the shape of truncated pyramids having an equilateral hexagonal or dodecagonal base face, the lateral extent is the distance between two opposite corners of the equilateral hexagon or dodecagon forming the base face.

The structured dielectric layer can furthermore be structured once again before the etching process for producing the radiation coupling-out structures, for example by means of photolithography. In this way, the structure elements of the dielectric layer can be altered in such a way that the dimensions of the three-dimensional structures resulting from the etching process are adapted to the light coupling-out.

Particularly preferably, a light-emitting diode chip is produced by the method described here. In other words, the radiation-emitting semiconductor component is preferably a light-emitting diode chip. Particularly preferably, the light-emitting diode chip is a thin-film light-emitting diode chip.

A thin-film light-emitting diode chip comprises an epitaxially grown semiconductor layer sequence having an active radiation-generating zone, wherein the growth substrate is completely removed or thinned in such a way that by itself it no longer mechanically stabilizes the semiconductor layer sequence to a sufficient extent. In other words, the semiconductor layer sequence alone or together with a residual layer of the growth substrate alone is not self-supporting. For the mechanical stabilization of the semiconductor layer sequence, the thin-film light-emitting diode chip generally comprises a carrier fixed to the semiconductor layer sequence.

A reflective layer is furthermore preferably arranged between the semiconductor layer sequence and the carrier, said reflective layer being provided for directing electromagnetic radiation generated in the active zone during the operation of the thin-film light-emitting diode chip to the radiation exit surface of the thin-film light-emitting diode chip. In this case, the radiation exit surface of the thin-film light-emitting diode chip generally faces away from the carrier. In this case, the reflective layer is not necessarily embodied as an individual layer, rather the reflective layer can comprise different individual layers. The reflective layer can comprise a dielectric layer and a metallic layer, for example. Furthermore, the reflective layer can also be a Bragg mirror.

Particularly preferably, the radiation exit surface of the thin-film light-emitting diode chip is provided with the radiation coupling-out structures already described.

Further advantageous embodiments and developments of the invention will become apparent from the exemplary embodiments described below in conjunction with the figures.

With reference to the schematic sectional illustrations in FIGS. 1 to 11, one exemplary embodiment of the method is explained in greater detail.

Figure 12:
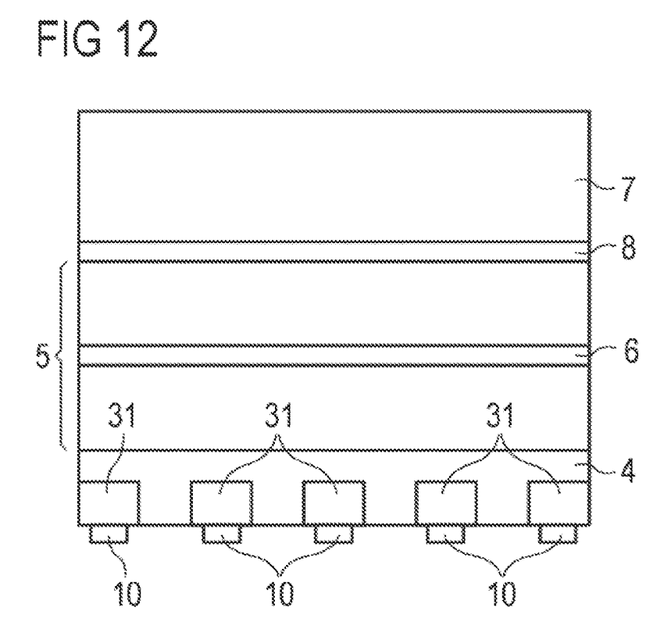
FIG. 12 is a schematic sectional illustrating an example embodiment in which a further photoresist layer is applied to the structure elements of the dielectric structured layer and is structured again.
Figure 13:
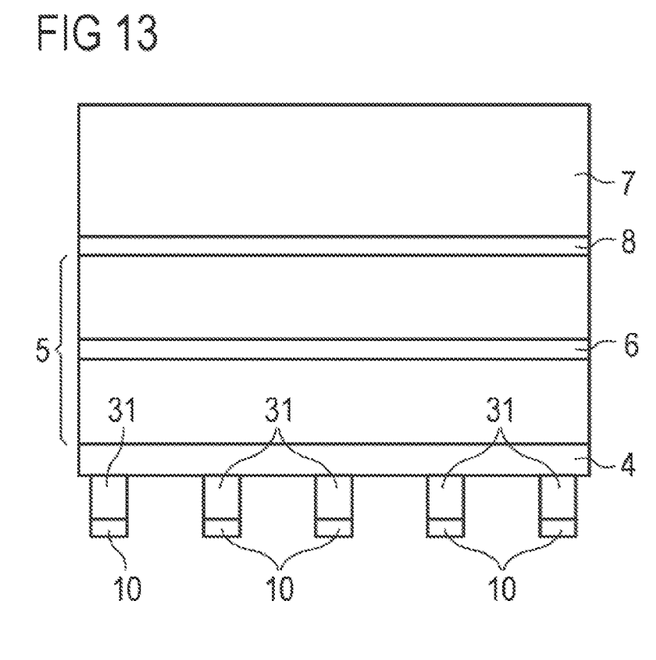
FIG. 13 is a schematic sectional illustrating an example embodiment in which an etching process is carried out for the dielectric layer, such that the structure elements are structured again in accordance with the second photoresist layer.
Figure 14:
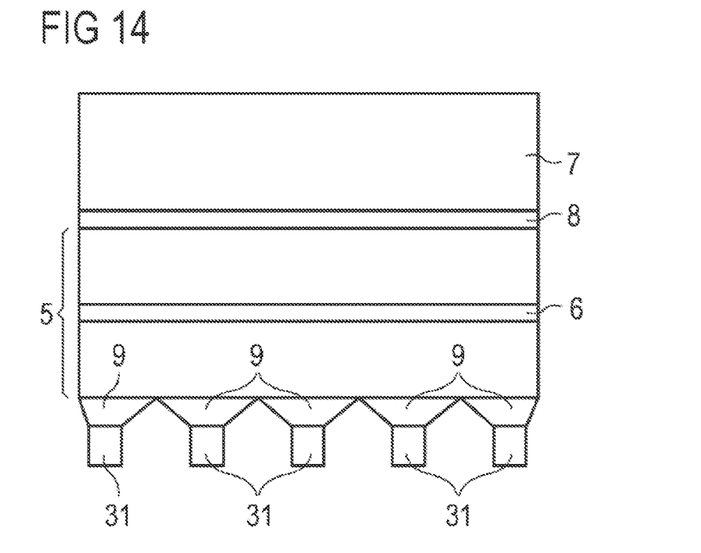
FIG. 14 is a schematic sectional illustrating an example embodiment in which the structure elements of the dielectric layer are used as a hard mask in the etching process in which the radiation coupling-out structures are produced.

With reference to the schematic sectional illustrations illustrated in FIGS. 12 to 14, a further exemplary embodiment of the method is explained in greater detail.

Figure 15:
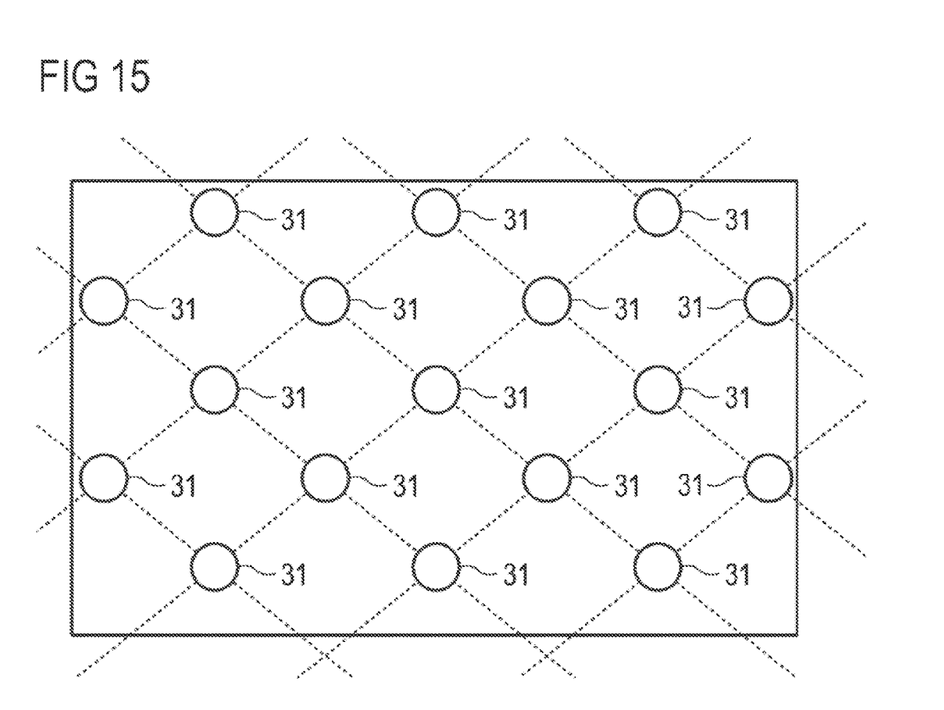
FIG. 15 is a schematic plan view illustrating an example embodiment of a structured dielectric layer.

FIG. 15 shows a schematic plan view of a structured dielectric layer in accordance with one exemplary embodiment.

Elements that are identical, of identical type or act identically are provided with the same reference signs in the figures. The figures and the size relationships of the elements illustrated in the figures among one another should not be regarded as to scale. Rather, individual elements, in particular layer thicknesses may be illustrated with an exaggerated size in order to enable better illustration and/or in order to afford a better understanding.

Figure 1:
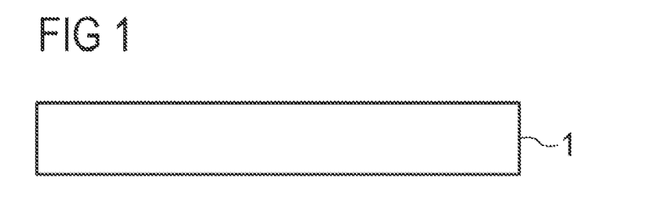
FIG. 1 is a schematic sectional illustrating an example embodiment in which a growth substrate is provided in a first step.

As shown with reference to the schematic sectional illustration in accordance with FIG. 1, in one exemplary embodiment of the method, a growth substrate 1 is provided in a first step. In the present case, the growth substrate 1 is suitable for epitaxially depositing layers based on a nitride compound semiconductor material. The material of the growth substrate 1 can be sapphire or silicon carbide, for example. Particularly preferably, the compound semiconductor material to be grown is gallium nitride.

Figure 2:
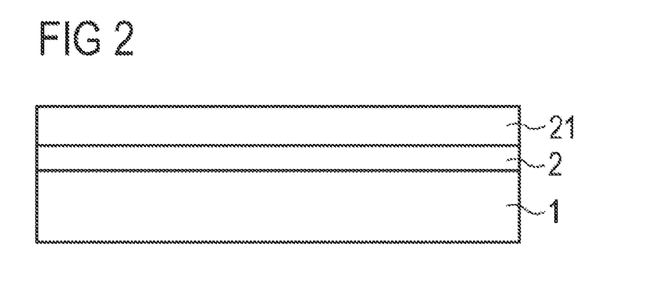
FIG. 2 is a schematic sectional illustrating an example embodiment in which a nucleation layer is applied on the growth substrate.

In a next step, which is shown schematically in the sectional illustration in FIG. 2, in the present exemplary embodiment, a nucleation layer 2 is applied on the growth substrate 1. The nucleation layer 2 is preferably based on a nitride compound semiconductor material. Particularly preferably, the nucleation layer 2 is deposited by sputtering and is formed from aluminum nitride. In the present case, the nucleation layer 2 furthermore preferably has a thickness of between 10 nm and 200 nm inclusive. A further layer 21 is deposited onto the nucleation layer 2. By way of example, the further layer 21 is deposited epitaxially on the nucleation layer 21. Preferably, the further layer is based on a nitride compound semiconductor material, for example gallium nitride. Preferably, the further layer 21 is formed from gallium nitride.

Figure 3:
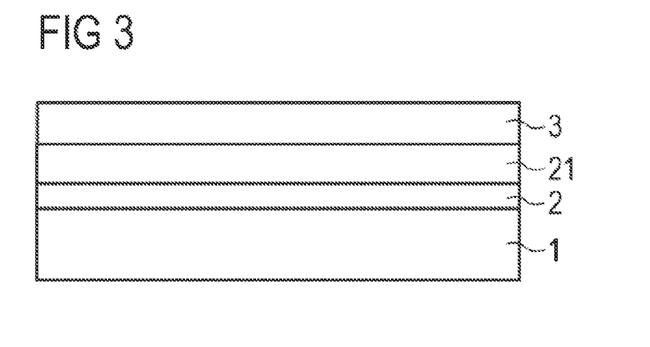
FIG. 3 is a schematic sectional illustrating an example embodiment in which a dielectric layer is applied to the further layer over the whole area.
Figure 4:
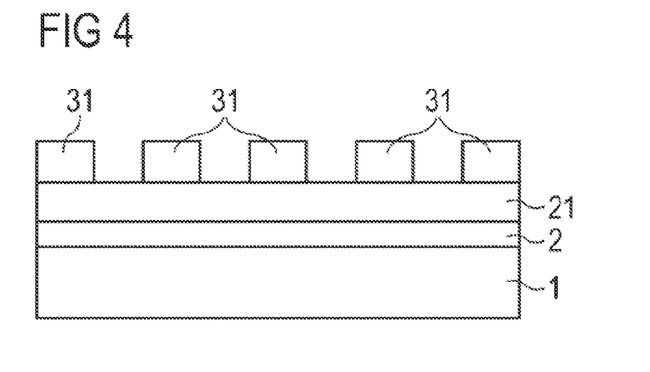
FIG. 4 is a schematic sectional illustrating an example embodiment of a structured dielectric layer.

In a next step, shown schematically in the sectional illustration in FIG. 3, a dielectric layer 3 is applied to the further layer 21 over the whole area, for example by sputtering. Particularly preferably, the dielectric layer 3 consists of one of the following materials or comprises one of the following materials: silicon oxide, silicon nitride, titanium nitride, tungsten nitride. The thickness of the dielectric layer 3 is preferably between 50 nm and 400 nm inclusive.

In a next step, the dielectric layer 3 is structured, for example by means of photolithography. During the photolithography, a photoresist layer is applied to the dielectric layer 3. The photoresist layer is generally firstly structured as desired by electromagnetic radiation. The structuring of the photoresist layer is subsequently transferred to the dielectric layer 3 by a further method step. In the present case, the structured dielectric layer 3 is illustrated schematically in the sectional illustration in FIG. 4, while the structuring by means of photolithography is not shown in the present case. Possible structure elements 31 of the dielectric layer 3 are described in greater detail further below with reference to FIG. 15.

Figure 5A:
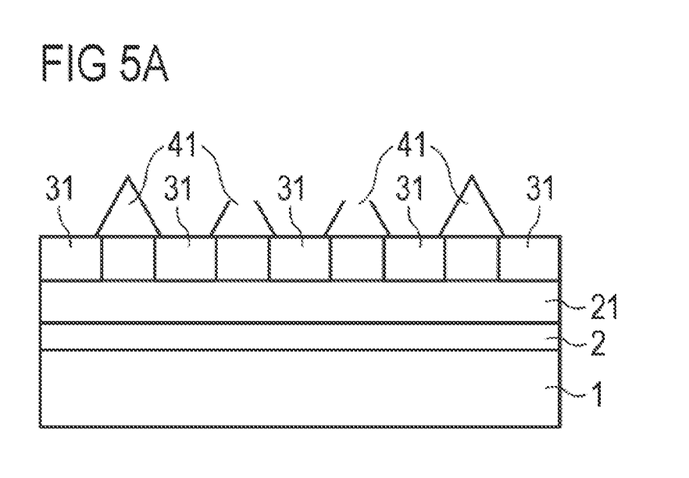
FIGS. 5A and 5B are schematic sectionals illustrating an example embodiment in which an epitaxial layer is deposited on the structured dielectric layer by means of a FACELO method.
Figure 5B:
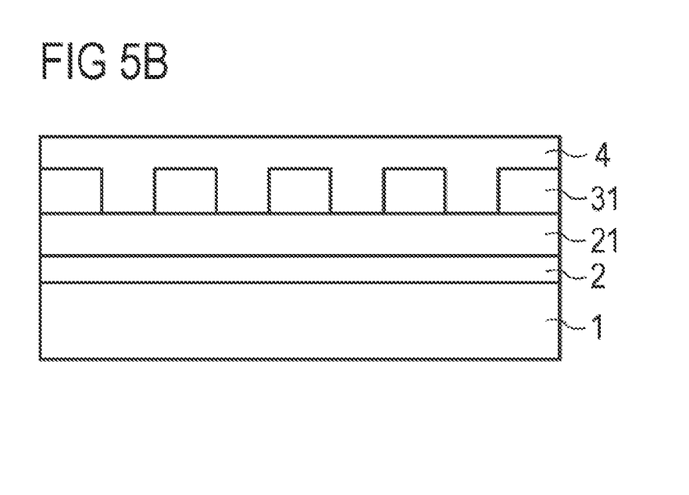

In a next step of the method, shown schematically in the sectional illustrations in FIGS. 5A and 5B, an epitaxial layer 4 is deposited on the structured dielectric layer 3 by means of a FACELO method. In the FACELO method, firstly the exposed regions of the further layer 21 between the structure elements 31 of the dielectric structured layer 3 are filled with triangular structures 41 (FIG. 5A).

Furthermore, the growth parameters in the FACELO method are set in such a way that preferably a lateral overgrowth of the structure elements 31 of the structured dielectric layer 3 takes place after the formation of the triangular structures 41 between the structure elements 31 of the dielectric layer 3 (FIG. 5B). In this case, the FACELO process is continued in such a way that the epitaxial layer 4 attains a certain thickness above the further layer 21. The epitaxial layer 4 preferably has a thickness of between 2 μm and 5 μm inclusive.

Figure 6:
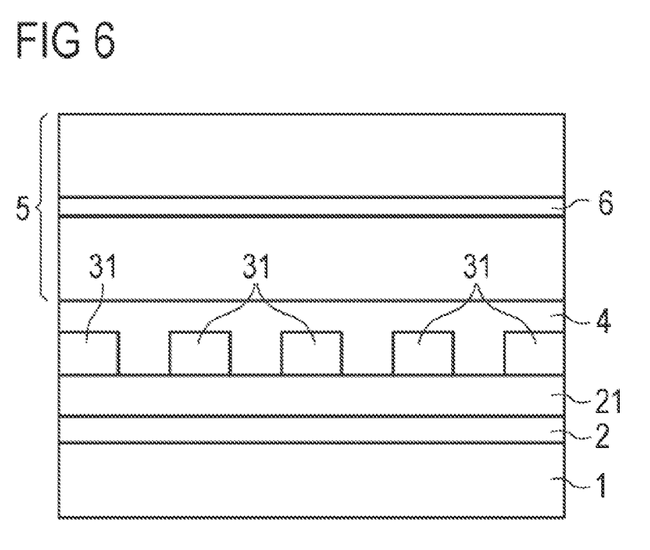
FIG. 6 is a schematic sectional illustrating an example embodiment in which an epitaxial semiconductor layer sequence is epitaxially deposited onto the epitaxially grown layer.

In a next step, shown schematically in the sectional illustration in FIG. 6, an epitaxial semiconductor layer sequence 5 is epitaxially deposited onto the epitaxially grown layer 4. In this case, the semiconductor layer sequence 5 comprises an active zone 6 that generates electromagnetic radiation during the operation of the subsequent semiconductor component. In this case, the semiconductor layer sequence 5 is preferably based on a nitride compound semiconductor material.

Figure 7:
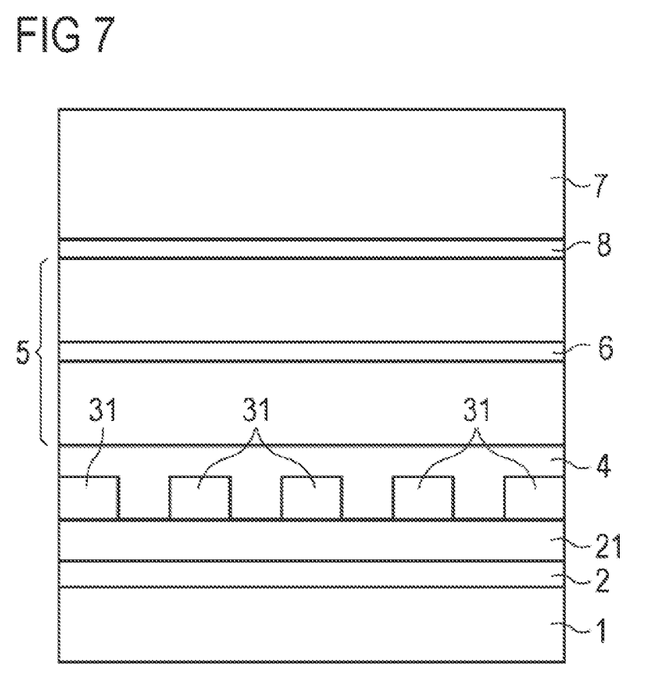
FIG. 7 is a schematic sectional illustrating an example embodiment in which a carrier is applied to the exposed surface of the epitaxially grown semiconductor layer sequence facing away from the growth substrate.

In a further step, shown schematically in FIG. 7, a carrier 7 is applied to the exposed surface of the epitaxially grown semiconductor layer sequence 5 facing away from the growth substrate 1. In this case, a reflective layer 8 is arranged between the epitaxial semiconductor layer sequence 5 and the carrier 7, said reflective layer being suitable for directing radiation generated in the active zone 6 to a radiation exit surface of the finished semiconductor component.

Figure 8:
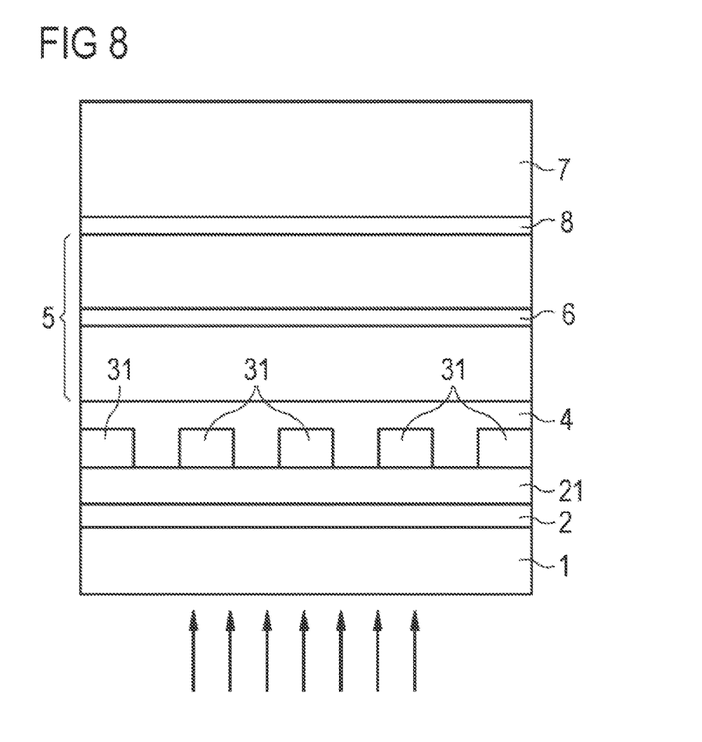
FIG. 8 is a schematic sectional illustrating an example embodiment in which the growth substrate is removed from the nucleation layer.
Figure 9:
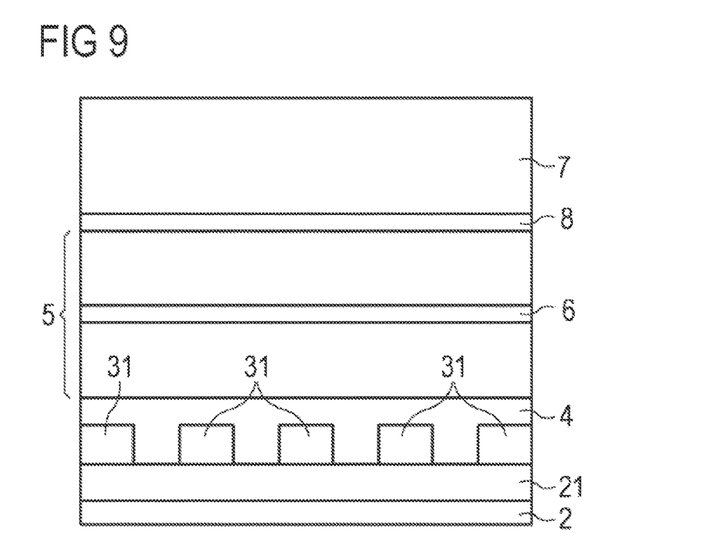
FIG. 9 is a schematic sectional illustrating an example embodiment in which, as a result of the removal of the growth substrate, the nucleation layer is exposed again.

Subsequently, as illustrated schematically in FIG. 8, the growth substrate 1 is removed from the nucleation layer 2, preferably by means of a laser lift-off method. As a result of the removal of the growth substrate 1, the nucleation layer 2 is exposed again, as illustrated schematically in FIG. 9.

Figure 10:
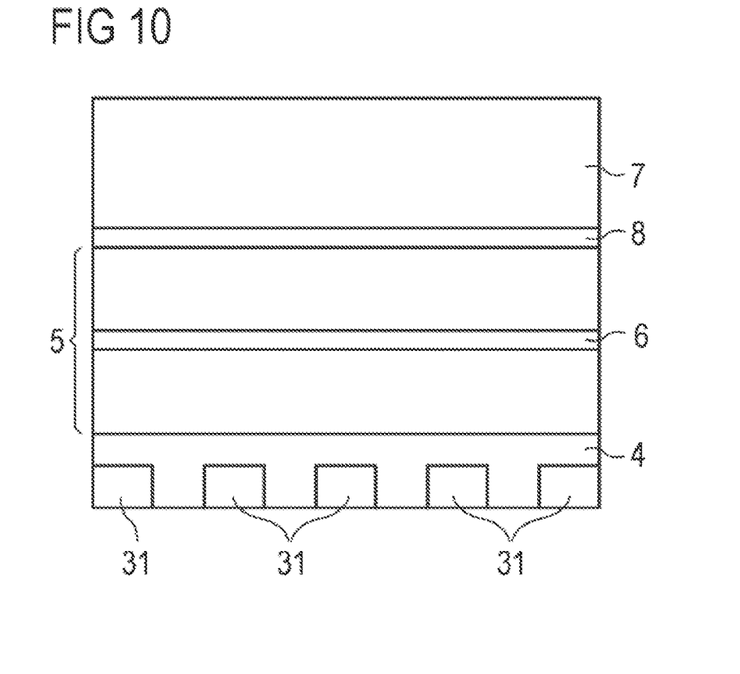
FIG. 10 is a schematic sectional illustrating an example embodiment in which the nucleation layer and the further layer are removed again.

In a further step, the nucleation layer 2 and the further layer 21 are also removed again, for example by etching using phosphoric acid or potassium hydroxide solution (FIG. 10).

If the nucleation layer 2 is a layer which comprises aluminum nitride or consists of aluminum nitride, then it is generally advantageously removed simultaneously with the growth substrate 1 during the laser lift-off method, such that a further method step for removing the nucleation layer 2 is obviated (not illustrated).

Figure 11:
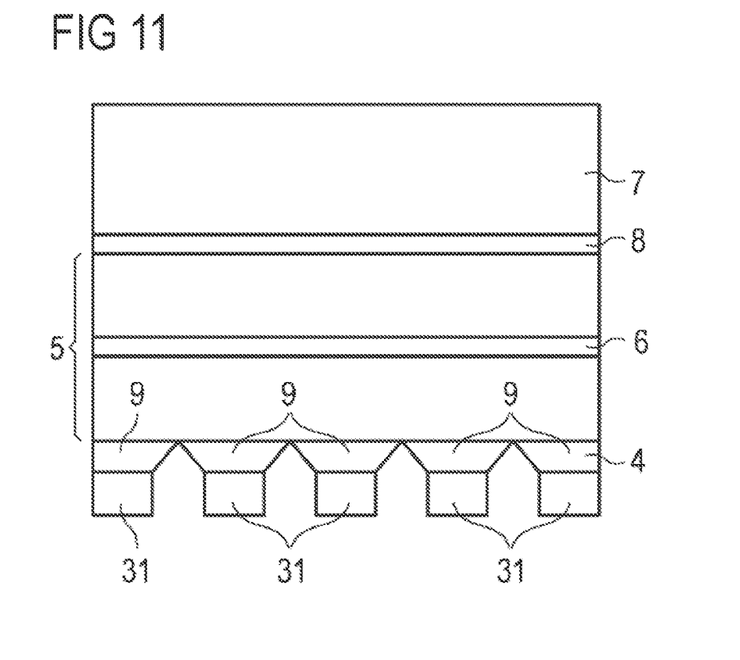
FIG. 11 is a schematic sectional illustrating an example embodiment in which in which three-dimensional radiation coupling-out structures are produced proceeding from the exposed surface of the epitaxial layer.

In a further method step, the structured dielectric layer 3 then serves as a hard mask in a further etching process, in which three-dimensional radiation coupling-out structures 9 are produced proceeding from the exposed surface of the epitaxial layer 4. In this case, the radiation coupling-out structures 9 are not necessarily restricted to the epitaxial layer 4, but rather can extend right into the epitaxial semiconductor layer sequence 5. In this case, the structure elements 31 of the structured dielectric layer 3 can remain in the finished semiconductor component or can alternatively be removed from the radiation coupling-out structures 9.

A further exemplary embodiment of the method is described in greater detail below with reference to the schematic sectional illustrations in FIGS. 12 to 14. FIG. 10 of the first exemplary embodiment constitutes the starting point of this exemplary embodiment. The epitaxial layer 4 and the structure elements 31 of the dielectric layer 3 are exposed in this method step.

In a further step, a further photoresist layer 10 is applied to the structure elements 31 of the dielectric structured layer 3 and is structured again (FIG. 12). Particularly preferably, in this case the photoresist layer 10 is structured in such a way that it covers only partial regions of the structure elements 31 of the dielectric layer 3. In a further step, an etching process is then carried out for the dielectric layer 3, such that the structure elements 31 are structured again in accordance with the second photoresist layer 10. Particularly preferably, the structure elements 31 of the dielectric layer are reduced in size in this case (FIG. 13).

In a further step, the structure elements 31 of the dielectric layer 3 are in turn used as a hard mask in the etching process in which the radiation coupling-out structures 9 are produced (FIG. 14).

With the aid of the second photostructuring, the structure elements 31 of the dielectric layer can advantageously be adapted to changed size dimensions of the hard mask for producing suitable radiation coupling-out structures.

FIG. 15 shows a schematic plan view of a structured dielectric layer 3 in accordance with one exemplary embodiment. The structured dielectric layer 3 in accordance with the exemplary embodiment in FIG. 15 has regularly arranged structure elements 31 in the form of islands. In this case, the structure elements 31 are arranged in a manner distinct from one another and spaced apart from one another laterally. In other words, the structure elements 31 preferably do not overlap one another.

In the present exemplary embodiment, the structure elements 31 are embodied in circular fashion. However, it is also possible for the structure elements 31 to be embodied in hexagonal, rectangular or dodecagonal fashion.

In the present case, the structure elements 31 are arranged along an imaginary regular hexagonal lattice. Particularly preferably, the geometric centroids of the structure elements 31 are in this case congruent with the lattice points.

In the exemplary embodiment in accordance with FIG. 15, the structure elements 31 of the dielectric structured layer 3 are embodied as islands. Alternatively, it is also possible for the structure elements 31 to be embodied as openings in the dielectric layer 3. In this case, the openings preferably penetrate completely through the dielectric layer 3.

The present application claims the priority of the German application DE 10 2012 101 211.3, the disclosure content of which is hereby incorporated by reference.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A method for producing a radiation-emitting semiconductor component comprising the following steps:
   providing a growth substrate;
   depositing a nucleation layer formed from aluminum nitride on the growth substrate by sputtering;
   applying a structured dielectric layer to the nucleation layer;
   applying an epitaxial layer on the structured dielectric layer by means of a FACELO method; and
   epitaxially growing an epitaxial layer sequence onto the epitaxial layer,
   wherein the epitaxial layer sequence comprises an active zone suitable for generating electromagnetic radiation, and
   wherein the structured dielectric layer serves as a hard mask in an etching process.

2. The method according to claim 1, wherein applying the structured dielectric layer to the nucleation layer comprises the following steps:
   depositing the dielectric layer over the whole area on the nucleation layer; and
   structuring the dielectric layer by means of photolithography.

3. The method according to claim 1, wherein the dielectric structured layer has openings in the structured layer as structure elements, the openings completely penetrating through the structured dielectric layer and the etching process etches a layer beneath the hard mask through the openings.

4. The method according to claim 3, wherein the structure elements are embodied in circular, hexagonal, rectangular or dodecagonal fashion.

5. The method according to claim 1, wherein the dielectric structured layer has islands as structure elements, the islands being arranged in a manner spaced apart from one another laterally.

6. The method according to claim 1, wherein the structure elements have a diameter that is not greater than 5 µm.

7. The method according to claim 1, wherein the structure elements are at a lateral distance from one another that is between 1 µm and 10 µm inclusive.

8. The method according to claim 1, wherein the structure elements are arranged along a regular pattern.

9. The method according to claim 1, wherein the structure elements are arranged in accordance with a two-dimensional hexagonal lattice.

10. The method according to claim 1, wherein a carrier is applied to the epitaxial layer sequence, and wherein the growth substrate is subsequently removed.

11. The method according to claim 10, wherein the nucleation layer is likewise removed again after the removal of the growth substrate or simultaneously with the growth substrate.

12. The method according to claim 1, wherein during the etching process regular three-dimensional structures are produced as radiation coupling-out structures in the surface of the epitaxial semiconductor layer sequence.

13. The method according to claim 12, wherein the three-dimensional structures have the shape of a pyramid or of a truncated pyramid.

14. The method according to claim 1, wherein the structured dielectric layer is structured again before the etching process.

15. The method of claim 1, wherein a carrier is applied to a top side of the epitaxial layer sequence that is opposite to the growth substrate, and the growth substrate and the nucleation layer are subsequently removed, wherein after removal of the growth substrate, the dielectric layer is freely accessible from an underside, lying opposite to the top side.

16. The method according to claim 1, wherein the epitaxial layer and the epitaxial layer sequence comprise gallium nitride.

17. The method of claim 1, wherein the dielectric layer is applied to the nucleation layer by sputtering.

18. The method according to claim 1, wherein a carrier is applied to the epitaxial layer sequence, and the growth substrate is subsequently removed by a laser lift off process.

19. A method for producing a radiation-emitting semiconductor component comprising the following steps:
   providing a growth substrate;
   depositing a nucleation layer on the growth substrate;
   applying a structured dielectric layer to the nucleation layer;
   applying an epitaxial layer comprising gallium nitride on the structured dielectric layer by means of a FACELO method, such that the epitaxial layer forms a closed surface over the entire structured dielectric layer; and
   epitaxially growing an epitaxial layer sequence onto the epitaxial layer,
   wherein the epitaxial layer sequence comprises an active zone suitable for generating electromagnetic radiation,
   wherein the structured dielectric layer serves as a hard mask in an etching process, and
   wherein the structured dielectric layer serves as a hard mask in the FACELO method and in an etching process, the etching process etches a layer beneath the hard mask.

20. The method according to claim 19, wherein a carrier is applied to the epitaxial layer sequence, and wherein the growth substrate is subsequently removed.

21. A method for producing a radiation-emitting semiconductor component comprising the following steps:
- providing a growth substrate;
- depositing a nucleation layer on the growth substrate;
- applying a structured dielectric layer to the nucleation layer;
- applying an epitaxial layer comprising gallium nitride on the structured dielectric layer by means of a FACELO method, such that the epitaxial layer forms a closed surface over the entire structured dielectric layer; and
- epitaxially growing an epitaxial layer sequence onto the epitaxial layer,
- wherein the epitaxial layer sequence comprises an active zone suitable for generating electromagnetic radiation,
- wherein the structured dielectric layer serves as a hard mask in an etching process, and
- wherein during the etching process, regular three-dimensional structures are produced as radiation coupling-out structures in the surface of the epitaxial layer sequence.

22. The method according to claim 21, wherein at least a majority of the radiation coupling-out structures have the same height and the same base area within the scope of production and measurement tolerances.

* * * * *